US 6,542,860 B1

(12) United States Patent
McBride

(10) Patent No.: US 6,542,860 B1
(45) Date of Patent: Apr. 1, 2003

(54) SYSTEM AND METHOD FOR DETECTING NODES THAT ARE SUSCEPTIBLE TO FLOATING

(75) Inventor: John G McBride, Ft Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/273,783

(22) Filed: Mar. 22, 1999

(51) Int. Cl.$^7$ ............................................... G06F 17/50
(52) U.S. Cl. ................... 703/14; 703/2; 716/5; 716/6
(58) Field of Search ..................... 703/2, 19, 14; 716/5, 17, 6, 8; 324/158.1; 365/201

(56) References Cited

U.S. PATENT DOCUMENTS

| | | | | |
|---|---|---|---|---|
| 5,432,441 A | * | 7/1995 | El-Ayat et al. ............ | 324/158.1 |
| 5,446,674 A | * | 8/1995 | Ikeda et al. .................. | 364/489 |
| 5,995,425 A | * | 11/1999 | Henkels et al. ............. | 365/201 |
| 6,113,648 A | * | 9/2000 | Schuelein et al. | |
| 6,128,687 A | * | 10/2000 | Dao et al. .................... | 710/129 |
| 6,260,180 B1 | * | 7/2001 | McBride | |
| 6,279,144 B1 | * | 8/2001 | Henkels et al. ................. | 716/5 |
| 6,305,003 B1 | * | 10/2001 | McBride ...................... | 716/12 |
| 6,311,314 B1 | * | 10/2001 | McBride ........................ | 716/6 |

* cited by examiner

Primary Examiner—Kevin J. Teska
Assistant Examiner—T. Phan

(57) ABSTRACT

The present invention is generally directed to a system and method for identifying nodes in a circuit design that are susceptible to floating. In accordance with one aspect of the invention, a method identifies nodes susceptible to floating by first detecting a node that is an output of a pass gate. The method then evaluates the circuit structure surrounding the node to ensure that the surrounding circuit structure is not one of several permissible structures. In this regard, the method ensures that the node is not an output node of a static gate. It also determines that the node is not an output of a multiplexer. If further verifies that the node is not an output of a pass gate that is always on. In addition, the method determines that the node drives a FET gate. In accordance with another aspect a computer readable storage medium, containing program code for evaluating a netlist, may be provided to detect a node that is susceptible to floating comprising. In this regard, the computer readable medium includes a first code segment configured to detect a node that is an output of a pass gate. It further includes a second code segment configured to ensure that the node is not an output node of a static gate. In addition, the computer readable medium includes a third code segment configured to determine that the node is not an output of a multiplexer. It further includes a fourth code segment configured to verify that the node is not an output of a pass gate that is always on. Finally, the computer readable medium includes a fifth code segment configured to determine that the node drives a FET gate.

20 Claims, 10 Drawing Sheets

SYSTEM AND METHOD FOR DETECTING NODES THAT ARE SUSCEPTIBLE TO FLOATING

BACKGROUND OF THE INVENTION

1. Field of the Invention

The present invention generally relates to computer-aided circuit design systems, and more particularly to a system and method for evaluating a netlist of an integrated circuit to detect storage nodes that are susceptible to begin left to undesirably float.

2. Discussion of the Related Art

Integrated circuits are electrical circuits comprised of transistors, resistors, capacitors, and other components on a single semiconductor "chip" in which the components are interconnected to perform a given function such as a microprocessor, programmable logic device (PLD), electrically erasable programmable memory (EEPROM), random access memory (RAM), operational amplifier, or voltage regulator. A circuit designer typically designs the integrated circuit by creating a circuit schematic indicating the electrical components and their interconnections. Often, designs are simulated by computer to verify functionality and ensure performance goals are satisfied.

In the world of electrical device engineering, the design and analysis work involved in producing electronic devices is often performed using electronic computer aided design (E-CAD) tools. As will be appreciated, electronic devices include electrical analog, digital, mixed hardware, optical, electromechanical, and a variety of other electrical devices. The design and the subsequent simulation of any circuit board, VLSI chip, or other electrical device via E-CAD tools allows a product to be thoroughly tested and often eliminates the need for building a prototype. Thus, today's sophisticated E-CAD tools may enable the circuit manufacturer to go directly to the manufacturing stage without costly, time consuming prototyping.

In order to perform the simulation and analysis of a hardware device, E-CAD tools must deal with an electronic representation of the hardware device. A "netlist" is one common representation of a hardware device. As will be appreciated by those skilled in the art of hardware device design, a "netlist" is a detailed circuit specification used by logic synthesizers, circuit simulators and other circuit design optimization tools. A netlist typically comprises a list of circuit components and the interconnections between those components.

The two forms of a netlist are the flat netlist and the hierarchical netlist. Often a netlist will contain a number of circuit "modules" which are used repetitively throughout the larger circuit. A flat netlist will contain multiple copies of the circuit modules essentially containing no boundary differentiation between the circuit modules and other components in the device. By way of analogy, one graphical representation of a flat netlist is simply the complete schematic of the circuit device.

In contrast, a hierarchical netlist will only maintain one copy of a circuit module which may be used in multiple locations. By way of analogy, one graphical representation of a hierarchical netlist would show the basic and/or non-repetitive devices in schematic form and the more complex and/or repetitive circuit modules would be represented by "black boxes." As will be appreciated by those skilled in the art, a black box is a system or component whose inputs, outputs, and general function are known, but whose contents are not shown. These "black box" representations, hereinafter called "modules", will mask the complexities therein, typically showing only input/output ports.

An integrated circuit design can be represented at different levels of bstraction, such as the Register-Transfer level (RTL) and the logic level, using a hardware description language (HDL). VHDL and Verilog are examples of HDL languages. At any abstraction level, an integrated circuit design is specified using behavioral or structural descriptions or a mix of both. At the logical level, the behavioral description is specified using boolean equations. The structural description is represented as a netlist of primitive cells. Examples of primitive cells are full-adders, NAND gates, latches, and D-Flip Flops.

Having set forth some very basic information regarding the representation of integrated circuits and other circuit schematics through netlists, systems are presently known that use the information provided in netlists to evaluate circuit timing and other related parameters. More specifically, systems are known that perform a timing analysis of circuits using netlist files. Although the operational specifics may vary from system to system, generally such systems operate by identifying certain critical timing paths, then evaluating the circuit to determine whether timing violations may occur through the critical paths. As is known, timing specifications may be provided to such systems by way of a configuration file.

One such system known in the prior art is marketed under the name PathMill, by EPIC Design Technology, Inc. (purchased by Synopsys). PathMill is a transistor-based analysis tool used to find critical paths and verify timing in semiconductor designs. Using static and mixed-level timing analysis, PathMill processes transistors, gates, and timing models. It also calculates timing delays, performs path searches, and checks timing requirements. As is known, PathMill can analyze combinational designs containing gates, and sequential designs containing gates, latches, flip-flops, and clocks. Combinational designs are generally measured through the longest and shortest paths.

While tools such as these are useful for the design verification process after layout, there are various shortcomings in the PathMill product and other similar products. For example, there is often a need to identify certain logic gates or particular combinations of logic gates. More specifically, there is often a need to identify combinations of gates that are configured in such a manner that may lead to operational uncertainty or performance problems.

By way of particular example, it is sometimes undesirable for certain nodes in a circuit to be left floating. For example, nodes that act as input nodes to other devices, if left floating, can create noise in the circuit, since the circuitry receiving the input node may react as though the floating input is toggling between high and low states, or otherwise varying the input.

Accordingly, it is generally desirable to identify such potentially deleterious nodes during a circuit design phase, in order to obtain a higher quality circuit design.

SUMMARY OF THE INVENTION

Certain objects, advantages and novel features of the invention will be set forth in part in the description that follows and in part will become apparent to those skilled in the art upon examination of the following or may be learned with the practice of the invention. The objects and advantages of the invention may be realized and obtained by means of the instrumentalities and combinations particularly pointed out in the appended claims.

To achieve the advantages and novel features, the present invention is generally directed to a system and method for identifying nodes in a circuit design that are susceptible to floating. In accordance with one aspect of the invention, a method identifies nodes susceptible to floating by first detecting a node that is an output of a pass gate. The method then evaluates the circuit structure surrounding the node to ensure that the surrounding circuit structure is not one of several permissible structures. In this regard, the method ensures that the node is not an output node of a static gate. It also determines that the node is not an output of a multiplexer. If further verifies that the node is not an output of a pass gate that is always on. In addition, the method determines that the node drives a FET gate.

In accordance with the preferred embodiment, the method includes the step of ensuring that the node does not include a NFET channel-connected to Ground having a gate that is the static inverse of the gate of the pass gate, and ensuring that the node does not include a PFET channel connected to VDD having a gate that is the same sense (i.e., not the static inverse) as the gate of the pass gate. It will be appreciated that this determination may be made "on the fly," or alternatively certain static timing analyzing programs (such as PathMill) may identify static inverse nodes, whereby the preferred embodiment of the present invention may simply utilize this information in carrying out the method.

In accordance with another aspect of the present invention a method may be provided for determining whether a node is susceptible to floating. In operation the method ensures that the node is an output of a pass gate and verifies that only one pass gate drives the node. In addition the method ensures that the node is not an output node of a static gate and determines that the node drives a FET gate. In accordance with a preferred embodiment, the method also ensures that the node does not include a channel-connected FET having a gate that is the static inverse of the gate of the pass gate.

In accordance with yet another aspect of the invention, a computer readable storage medium containing program code for evaluating a netlist to detect a node that is susceptible to floating comprising. In this regard, the computer readable medium includes a first code segment configured to detect a node that is an output of a pass gate. It further includes a second code segment configured to ensure that the node is not an output node of a static gate. In addition, the computer readable medium includes a third code segment configured to determine that the node is not an output of a multiplexer. It further includes a fourth code segment configured to verify that the node is not an output of a pass gate that is always on. Finally, the computer readable medium includes a fifth code segment configured to determine that the node drives a FET gate. Preferably, the computer readable storage medium also includes a sixth code segment configured to ensure that the node does not include a channel-connected FET having a gate that is the static inverse of the gate of the pass gate.

DESCRIPTION OF THE DRAWINGS

The accompanying drawings incorporated in and forming a part of the specification, illustrate several aspects of the present invention, and together with the description serve to explain the principles of the invention. In the drawings.

DETAILED DESCRIPTION OF THE PREFERRED EMBODIMENT

Figure 1:
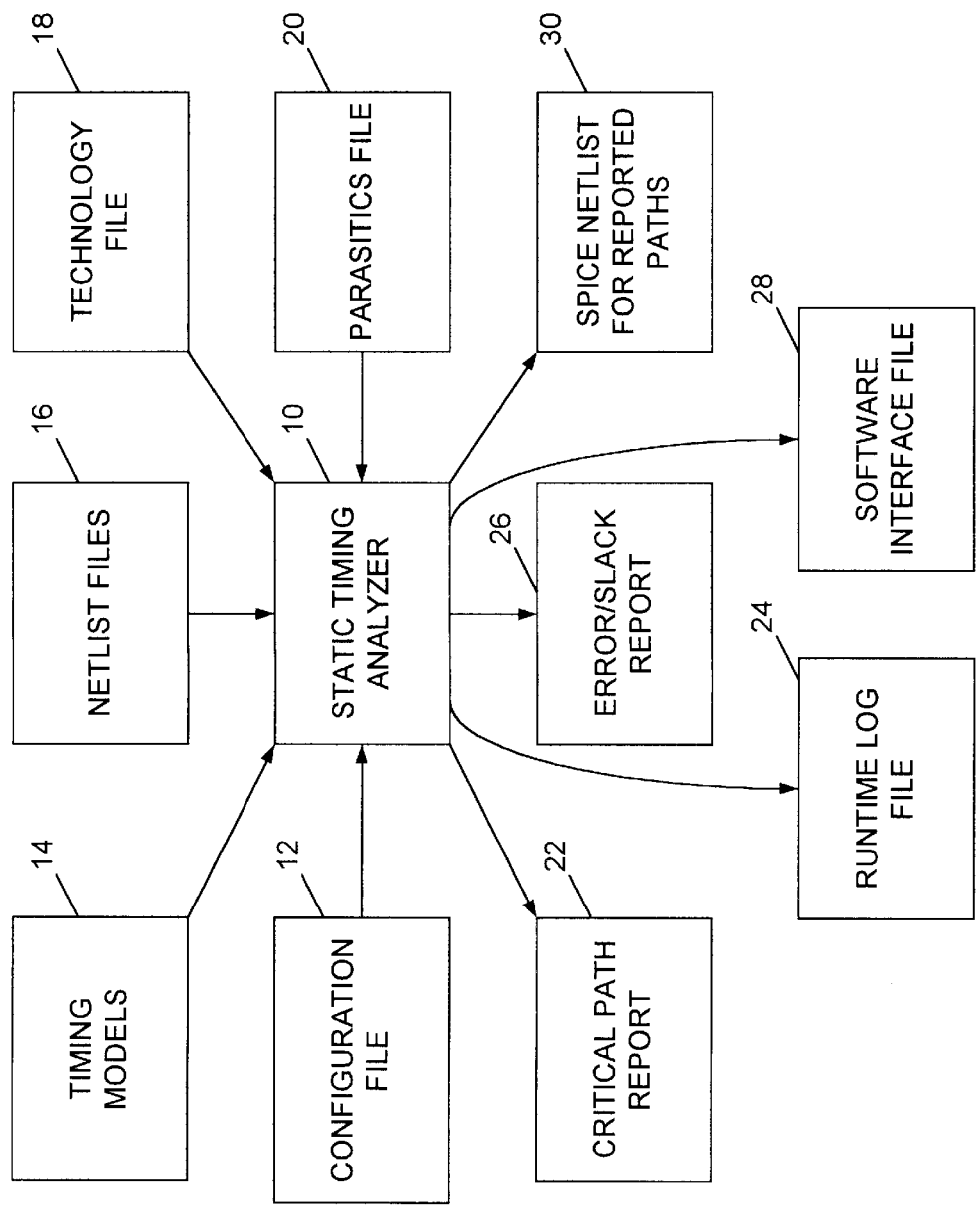
FIG. 1 is a block diagram of a static timing analyzer system, as is known in the prior art.

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

Referring now to the drawings, reference is made to FIG. 1, which is a block diagram of a prior art static timing analyzer program that illustrates the basic informational flow in such a system. Specifically, and as previously mentioned, one such system is marketed under the name PathMill. FIG. 1 is a diagram that illustrates the informational flow in the PathMill system. At the center of the diagram is a block denoted as static timing analyzer 10, which represents the PathMill program. Surrounding this block 10 are a number of other blocks that represent various input and output files and/or information.

More particularly, the PathMill program may utilize a configuration file 12, a file of timing models 14, one or more netlist files 16, a technology file 18, and a parasitic file 20, for various input information. In addition, the PathMill program may generate a number of different output files or other output information, including a critical path report 22, a runtime log file 24, an error report 26, a software interface file 28, and a SPICE netlist 30. When started, the PathMill program first processes the input netlist file(s) 16, the technology file 18, and the configuration file(s) 12. The information from these files is subsequently used for performing path analyses. Since the PathMill program is publicly available and marketed, its function and operation are well known, and therefore need not be discussed in detail herein.

For purposes of illustrating the present invention, much of the diagram and information illustrated in FIG. 1 is not shown in connection with the inventive system. In this regard, reference is made to FIG. 2, which shows one embodiment of a system constructed in accordance with the present invention. In the illustrated embodiment, only the static timing analyzer 10, the configuration file 12 and the netlist file 16 of FIG. 1 are shown. The configuration file(s) 12 contains information that informs the static timing analyzer 10 how to perform its analysis, and various numbers of configuration files may be used. The netlist file 16, as is known, defines the various integrated circuit components, and their interrelations.

Figure 2:
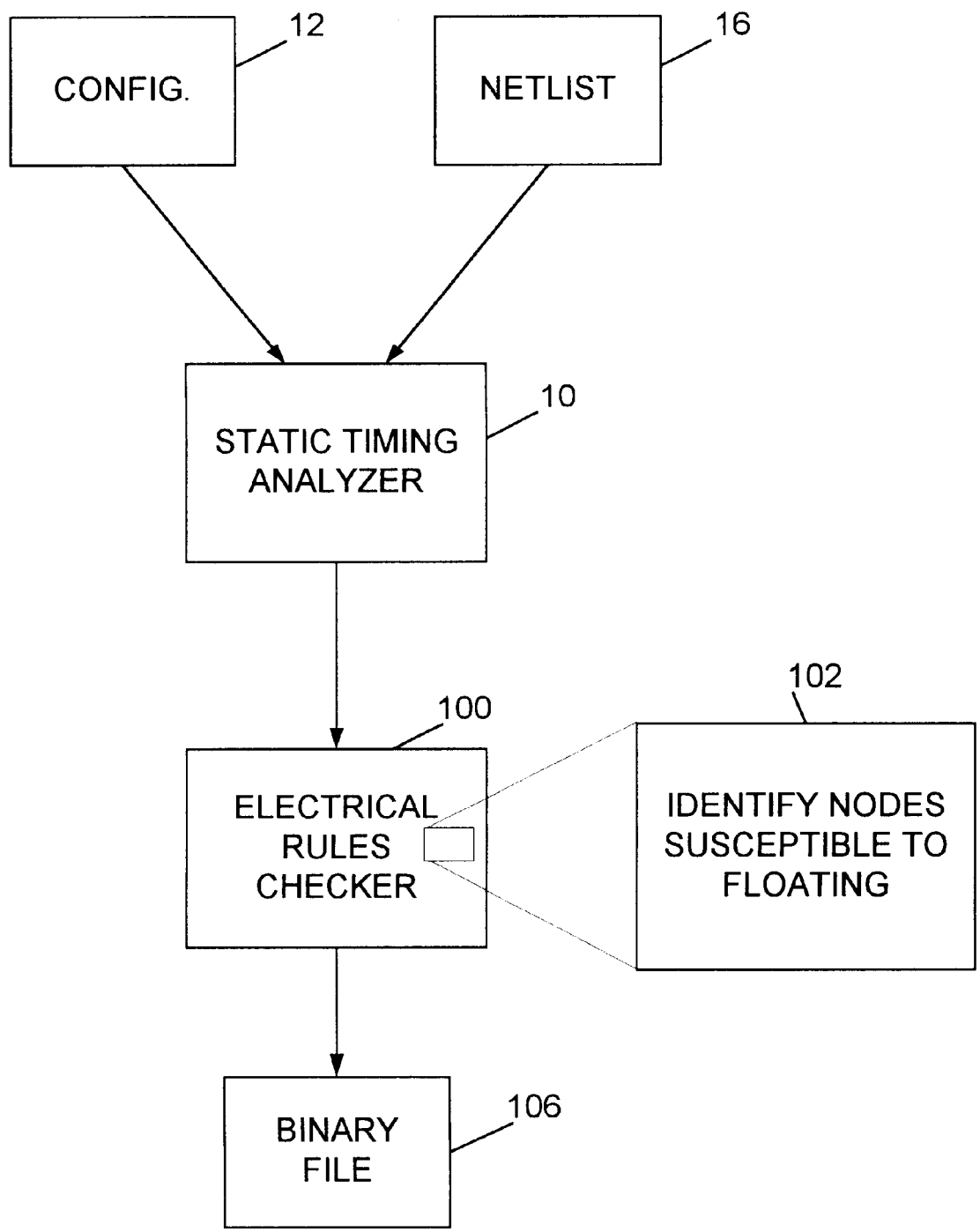
FIG. 2 is a block diagram illustrating the orientation of the electrical rules checking method of the present invention, in relation to an existing static timing analyzer.

The system shown in FIG. 2 preferably utilizes a computer (not shown) for its operation which runs the static timing analyzer program 10 and the electrical rules checker program 100. The computer may be electrically coupled to a memory device (not shown) which functions as a system storage unit for storing the code and data utilized and/or generated by the system. Those skilled in the art will realize that the present invention is not limited to any particular type of computer or memory device for performing these functions.

It should also be noted that the term "computer", as that term is used herein, is intended to denote any machine capable of performing the calculations, or computations, necessary to perform the tasks of the present invention. In essence, this includes any machine that is capable of accepting a structured input and of processing the input in accordance with prescribed rules to produce an output. Furthermore, those skilled in the art will understand that the system shown in FIG. 2 may be implemented in hardware, software, or a combination of both, and is not limited to any particular physical, structural, or electrical configuration.

The electrical rules checker 100 program of the present invention is preferably configured to operate on an output of the static timing analyzer 10. In this regard, the static timing analyzer may be configured to generate an output netlist database, which the electrical rules checker 100 of the present invention utilizes as an input. As previously mentioned, there are a wide variety of reasons why an electrical rules checking program may be desired. One such reason is to perform various checks over certain rules or strategies in an integrated circuit design. Such rules may vary from circuit to circuit, depending upon the particular application. For example, a portion 102 of the electrical rules checker program 100 operates to identify nodes that are susceptible to charge sharing. This is only one example of the multitude of checks which may be performed by the electrical rules checker program 100 of the present invention.

As is known, a large scale integrated circuit design is often done at the FET level. A designer may utilize thousands of interconnected FETs in designing a portion of an integrated circuit. Although the designer may make every effort to follow certain design guidelines, mistakes may nevertheless be made. Accordingly, the electrical rules checker 100 of the present invention provides an excellent mechanism for double-checking designs and design layouts. Furthermore, the electrical rules checker 100 of the present invention may generate an output binary file 106, which may ultimately be used in subsequent executions of the electrical rules checker 100.

However, prior to the electrical rules checker 100 of the present invention performing any of the rules checking tasks, a database of nodes and elements of the circuit to be evaluated is generated. This database is then utilized by the electrical rules checker 100 of the present invention to perform the rules checking tasks.

However, it should be noted that the database and the method in which it is generated is not limited to use with any particular rules checker. They may be used with virtually any type of rules checker which evaluates nodes for design quality. For example, the database of the present invention may also be used with rules checkers which evaluate nodes for optical computing systems, mechanical systems and chemical systems. It will be apparent to those skilled in the art how data structures similar to those generated for elements and nodes in the electrical context may be generated in mechanical, chemical and optical computing contexts and used for rules checking in those contexts.

The manner in which this database is generated will now be discussed below with respect to FIGS. 3A–3C. For purposes of illustration, it will be assumed that the static timing analyzer 10, shown in FIG. 2 and discussed above, is the PathMill static timing analyzer, in order to provide an example of one possible implementation of the present invention. However, those skilled in the art will understand that the electrical rules checker 100 of the present invention and the database of the present invention are not limited to use with any particular program.

The PathMill static timing analyzer provides an application program interface (API) which allows the PathMill static timing analyzer to communicate with the electrical rules checker 100 of the present invention. This API allows code external to the PathMill program to be linked to the PathMill program so that the external code and the PathMill program itself comprise one executable which can be run as a single program. The electrical rules checker 100 of the present invention utilizes this API to obtain information from the PathMill static timing analyzer which can be utilized by the electrical rules checker 100 to generate the database of the present invention, as indicated by block 102.

Prior to the database of the present invention being generated, the PathMill program runs and identifies circuit characteristics of the circuit under consideration such as, for example, FET direction, node types, latches, dynamic gates, clocks, rise and fall times, etc. Before the PathMill program terminates, it calls the electrical rules checker 100 of the present invention. The PathMill program has a feature commonly referred to as "hooks", which allows the PathMill program to call routines at various stages of execution. Once the PathMill program has finished identifying the characteristics mentioned above, the PathMill program calls the electrical rules checker 100 of the present invention. The electrical rules checker 100 of the present invention, through this series of subroutine calls, creates its own database of the circuit under consideration.

Figure 3A:
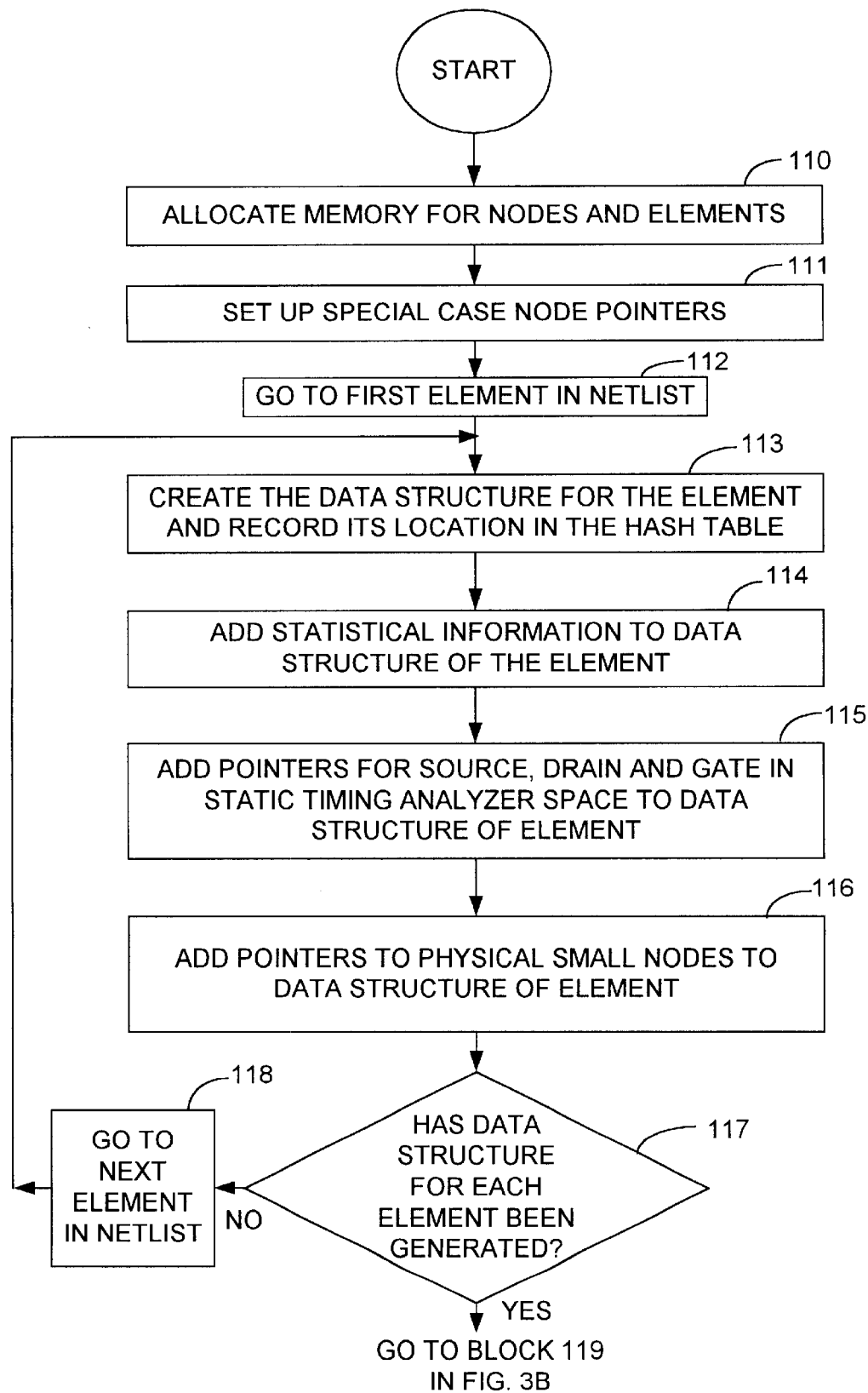
FIGS. 3A–3C collectively depict a flowchart that illustrates a process of generating a database of certain circuit element and node characteristics and properties that my be utilized by the preferred embodiment of the present invention to identify nodes susceptible to floating.
Figure 3B:
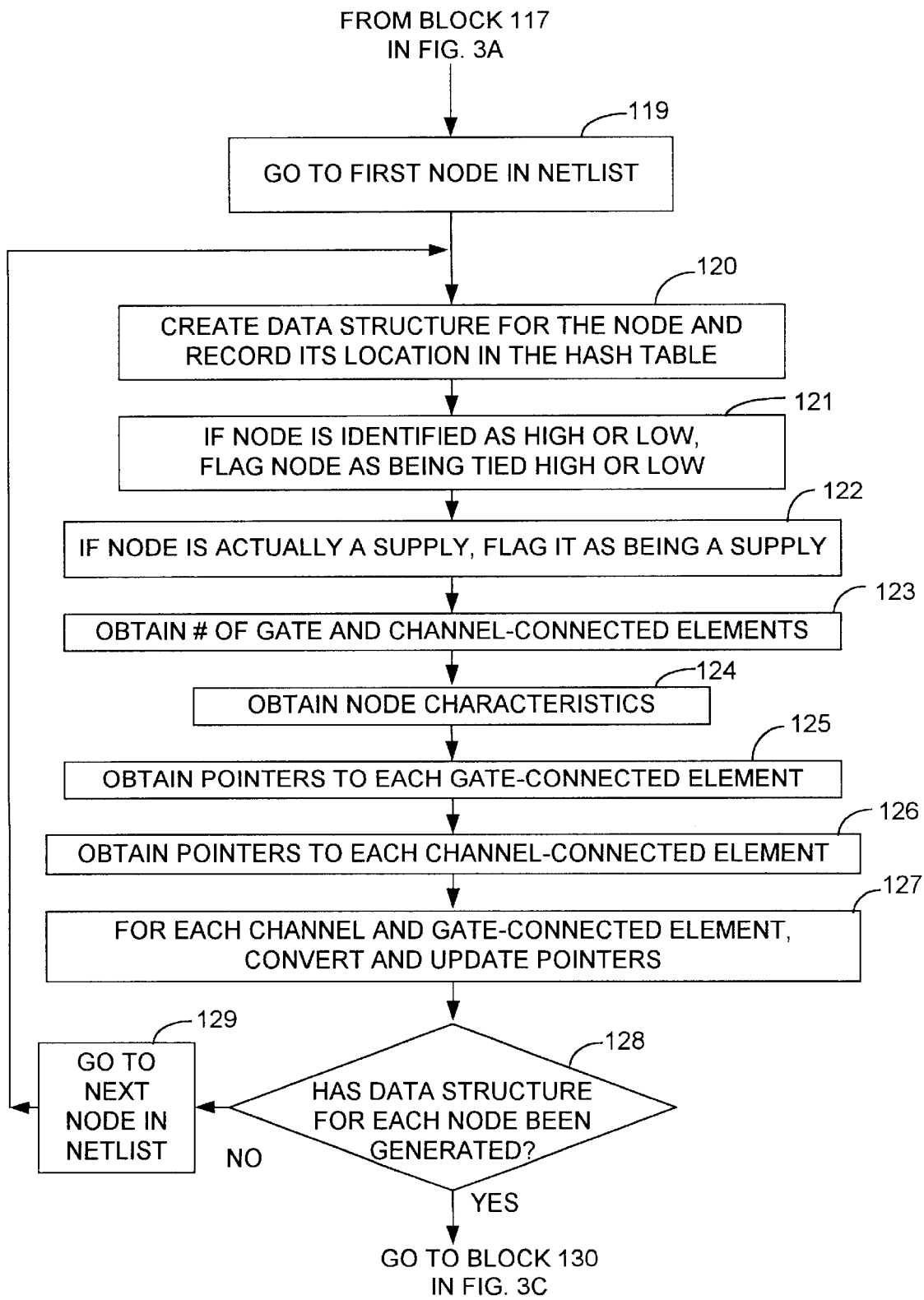

The first step in the process of generating the database is to allocate memory for the nodes and elements of the circuit, as indicated by block 110 in FIG. 3A. The PathMill program provides information via its API about the number of elements and nodes in the circuit of the electrical rules checker 100 and this information is utilized by the electrical rules checker 100 to perform memory allocation. Certain types of nodes and elements do not require as much information about their characteristics as do other types of nodes and elements. Therefore, the amount of memory allocated may vary for different types of nodes and elements. Rather than merely basing memory allocation on the number of nodes and elements in the circuit, it may be desirable to distinguish between different types of nodes and elements so that memory can be more efficiently allocated. However, it will be apparent to those skilled in the art that the present invention is not limited with respect to the manner in which memory space is allocated for the nodes and elements. Those skilled in the art will understand the manner in which the memory allocation task, and any optimizations of it, can be performed. Therefore, in the interest of brevity, a detailed discussion of the memory allocation task for the nodes and elements will not be provided herein.

Once memory has been allocated for the nodes and elements, the next step in the process of the present invention is to set up node pointers for special cases of nodes, as indicated by block 111. These special types of nodes will be used repeatedly during the process of generating the database, as discussed below in more detail. Therefore, the pointers for these nodes preferably are set up relatively early in the database generation process. For example, nodes which correspond to the supplies (GND and VDD) are special types of nodes and it is helpful to set up node pointers for these types of nodes. This is done by finding the nodes whose names match the known names of the supply nodes.

For each element, a data structure must be generated which can be utilized by the electrical rules checker 100 in performing the rules checking tasks. Steps 113–116 in FIG. 3A correspond to the steps for creating the element data structures. The first element for which a data structure must be generated is obtained during the step represented by block 112. The data structure for that element is then generated and the location of the data structure is recorded in a hash table, as indicated by block 113. This step is performed so that the element pointers into the space of the static timing analyzer can be used later to look up the element data structures in the space of the electrical rules checker 100. Hash tables and the manner in which they are utilized are well-known in the art. Therefore, a detailed discussion of the manner in which the pointers into the space of the static timing analyzer are converted using the hash table into pointers into the space of the electrical rules checker 100 will not be provided herein since persons skilled in the art will understand the manner in which this can be accomplished.

Statistical information relating to the element is then added to the data structure of the element, as indicated by block 114. This information includes, for example, the width of the element, the length of the element, the direction of the element, and the element type. Once the statistical information has been included in the data structure of the element, the pointers for the source, drain and gate of the element, as defined in the space of the static timing analyzer, are included in the data structure of the element, as indicated by block 115. The pointers that were set up in step 111 are utilized in step 115. If either the source, drain or gate of the element is attached to ground or VDD, then the pointers for the source, drain and gate are set to the pointers for ground or VDD obtained in step 111.

A circuit and the nodes of the circuit can be represented logically or physically, or as a combination of both. A logical representation of a circuit primarily comprises FETs and does not include any resistors for representing parasitic resistance of the interconnect material. The logical representation of a node is identified in the PathMill program as a "supernode". On the other hand, a physical representation of a node, which is identified in the PathMill program as a "small node", includes FETs, but also includes resistors, which correspond to the parasitic resistance in the node. Therefore, in the physical representation, a small node exists between the resistors representing the parasitic resistance and between any FET and any one of the resistors. In the physical representation, FETs may be connected to different small nodes whereas in the logical representation, those same FETs may be connected to the same supernode.

Each element has a pointer to a supernode and to a small node for each drain, source and gate. Therefore, there are six pointers for each FET. Each small node in the physical representation maps to one particular supernode in the logical representation. In block 116, the pointers corresponding to these small nodes are added to the data structure of the element. A determination is then made at block 117 as to whether or not data structures for all of the elements have been generated. If not, the next element in the netlist is obtained, as indicated by block 118, and the process returns to block 113. If so, the process proceeds to block 119 in FIG. 3B.

Once the data structures for the elements have been generated, the data structures for the nodes must be generated. Blocks 120–127 in FIG. 3B correspond to the steps in the process of the present invention for generating the data structures of the nodes. The first node for which the data structure is to be generated is obtained at the step represented by block 119. The data structure for the node is then generated and the location of the data structure is recorded in the hash table, as indicated by block 120.

For the purpose of design quality analysis, it is important to distinguish actual supply nodes, such as VDD and GND, from other circuit nodes which have been declared to be tied high or low for the purpose of timing or other analysis. In block 121, the rules checker 100 determines, through the use of PathMill API calls, which nodes have been declared to be tied high or low, or are actually high or low because they are actual supply nodes. The rules checker 100 flags the actual high nodes as high and the actual low nodes as low in the step represented by block 121. In the step represented by block 122, the nodes which are actually supplies are flagged as supplies in the database.

The electrical rules checker 100 then obtains the number of gate-connected elements and the number of channel-connected elements from the static timing analyzer, as indicated by block 123. The electrical rules checker 100 also obtains the characteristics of the nodes from the static timing analyzer 10, as indicated by block 124. These characteristics include, for example, capacitance, node type, rise and fall time, etc. Once the characteristics of the node have been obtained, the electrical rules checker 100 obtains the pointers provided by the static timing analyzer 10 that point to each gate-connected element, as indicated by block 125. The electrical rules checker 100 then obtains the pointers from the static timing analyzer which point to each channel-connected element, as indicated by block 126.

The element pointers that are stored in the node during the steps represented by blocks 125 and 126 are pointers into the space of the static timing analyzer. Similarly, the node pointers that are stored in the element during the step represented by block 115 are pointers into the space of the static timing analyzer, except that the pointers to the VDD and GND nodes are stored as pointers to the VDD and GND nodes in the space of the electrical rules checker 100. In the step represented by block 127, some of these pointers are converted to point to the elements and nodes in the space of the electrical rules checker 100. For each of the gate-connected and channel-connected elements of the current node, the following steps are performed, which are represented by block 127:

(1) the element pointer is converted to the corresponding element pointer into the space of the electrical rules checker 100 by looking it up in the hash table. This element pointer replaces the original element pointer in the node structure;

(2) the source, gate, and drain pointers in the element data structure are each checked to see if they point to the current node. If so, the node pointer (into the space of the static timing analyzer) is replaced with the pointer to the current node in the space of the electrical rules checker.

A determination is then made at block 128 as to whether or not data structures for all of the nodes have been generated. If not, the next node in the netlist is obtained, as indicated by block 129, and the process returns to block 120.

Figure 3C:
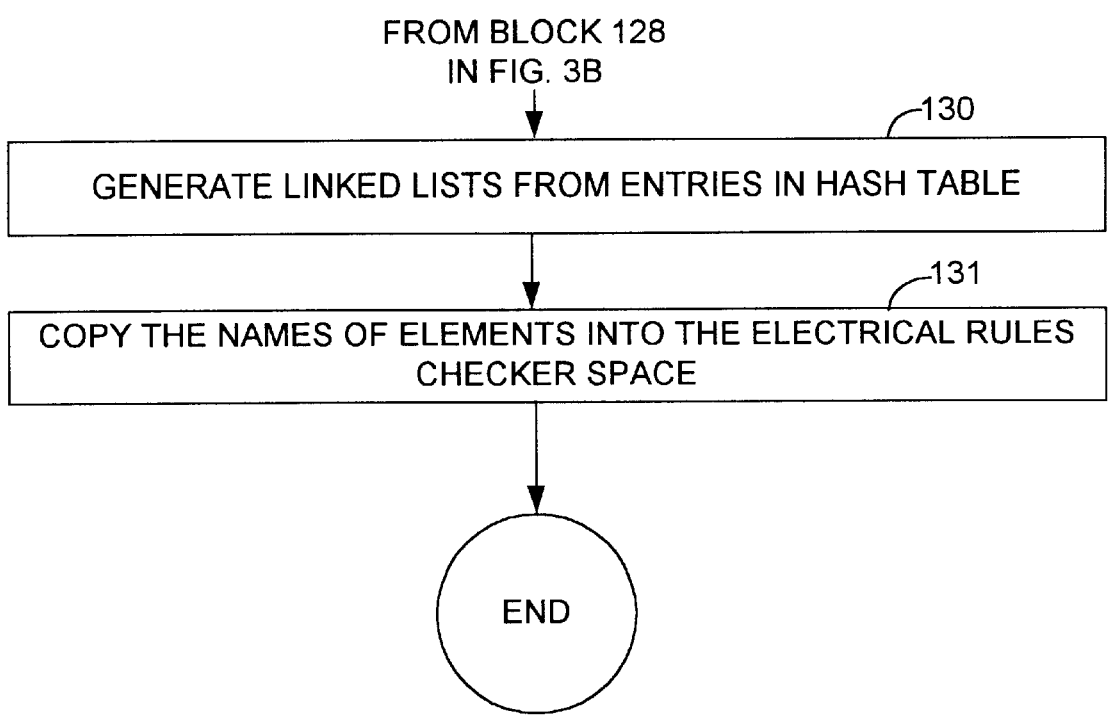

In order to enable the electrical rules checker 100 to maximize efficiency in searching the database of the present invention, once the data structures for all of the nodes have been created, linked lists of elements and nodes are generated from the entries in the hash table, as indicated by block 130 in FIG. 3C. These lists are used by the electrical rules checker 100 of the present invention in searching for an element in the database of the present invention. When searching for an element, the electrical rules checker 100 simply analyzes the elements contained in the linked list.

It should be noted that the arrangement of the elements and nodes in the linked lists may or may not have any physical relationship to the arrangement of the elements and nodes in the circuit under consideration. Thus, the linked lists are merely used to search through the elements and nodes stored in the database.

Once the linked lists have been generated, the names of the elements and nodes contained in the linked list are copied into electrical rules checker space, as indicated by block 131. This reduces the number of calls that need to be made to the PathMill program by the electrical rules checker 100. Once the database of the present invention has been generated, no more calls have to be made to the PathMill program via the PathMill API. The database of the present invention is comprised as the binary file 106 shown in FIG. 2.

Once the database of the present invention has been generated in the manner described above, the electrical rules checker 100 of the present invention utilizes this database to perform the rules checking tasks. As previously mentioned, one such task, and the one performed by the present invention is the identification of nodes that are susceptible to floating. Specifically, the present invention detects those nodes that are susceptible to floating in a manner that may be adverse to surrounding circuit components.

Figure 4:
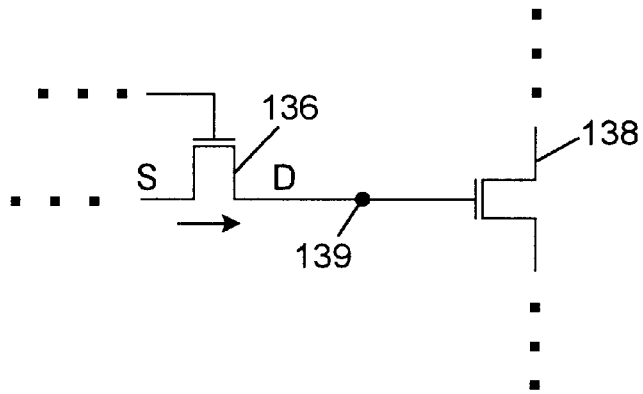
FIG. 4 is a schematic diagram illustrating a circuit configuration that is identified by the present invention as being susceptible to floating.

To better illustrate this point, reference is made to FIG. 4, which is a schematic diagram of a small circuit portion 134 comprising two gates 136 and 138. More specifically, gate 136 is configured to drive the gate node of FET 138. Simply defined, and for purposes of the present invention, a pass FET or a pass gate is a FET device that connects the output of one node to the input of another node across the channel nodes of the FET device. Using this definition, FET 136 may be readily recognized as a pass FET. Within this disclosure, the term pass gate will often be used in place of pass FET. As will be appreciated by persons skilled in the art, a pass FET is a subset of a pass gate. Thus, a pass FET is a pass gate, but a pass gate is not necessarily a pass FET. For example, a pair of complementary pass FETs also comprise a pass gate.

In accordance with a preferred embodiment of the present invention, the data structure (described above) for the circuit elements may be utilized to ascertain that element 136 is a pass gate. Broadly, a pass gate includes any of several pass gate configurations. In this regard, various flags are stored in an element data structure, including flags that indicate whether a given element is a complimentary pass FET pair, a RAM pass FET, or a single pass FET. The data structure also includes direction flags. Specifically, there are four direction flags associated with FETs, one of which is set to reflect the direction of a particular device. The direction flags include a source-to-drain direction flag, which is set if a FET is conducting from the source to the drain channel nodes. Another direction flag includes a drain-to-source direction flag, which is set if a FET device is conducting from the drain node to the source node. A third direction flag is set if the element is configured to be bi-directional. Finally, a fourth direction flag is set to specifically indicate that the conducting direction of the device is unset. As illustrated by the direction arrow shown in FIG. 4, the direction flag of element 136 is set from source to drain.

Therefore, the system and method of the present invention may readily recognize element 136 as a pass FET, wherein node 139 is an output node of the pass FET 136. The system and method of the present invention may further utilize the data structure and netlist to identify the gate node of FET 138 as being connected to the output node 139 of pass FET 136. This configuration, and specifically node 139, is one in which the system and method of the present invention will identify as being susceptible to being left floating. In this regard, it will be appreciated that, although not shown, the input side of FET 136 is not driven by a supply, as, by definition, a pass gate is a gate which connects an output of one element to an input of another element.

In one embodiment, the present invention may evaluate every node within a netlist to identify a surrounding structure like that illustrated in FIG. 4. If such a structure is identified, then the node may be identified in an error report that the electrical rules checker 100 generates to alert of various, potential design problems.

Having discussed the circuit illustrated in FIG. 4, it will be appreciated that in many instances, a similar circuit configuration may exist, and yet not be susceptible to the adverse affects of a floating node. Such similar configuration include nodes that are the output of a static gate, nodes that are the output of a multiplexer, output nodes of pass gates that are always turned on, and nodes (like node 139) further being channel-connected to a supply and having a gate that is the static inverse of the gate node of the pass gate. Certain of these permissible circuit configurations are illustrated in FIGS. 5A–5D, and are discussed below.

Figure 5A:
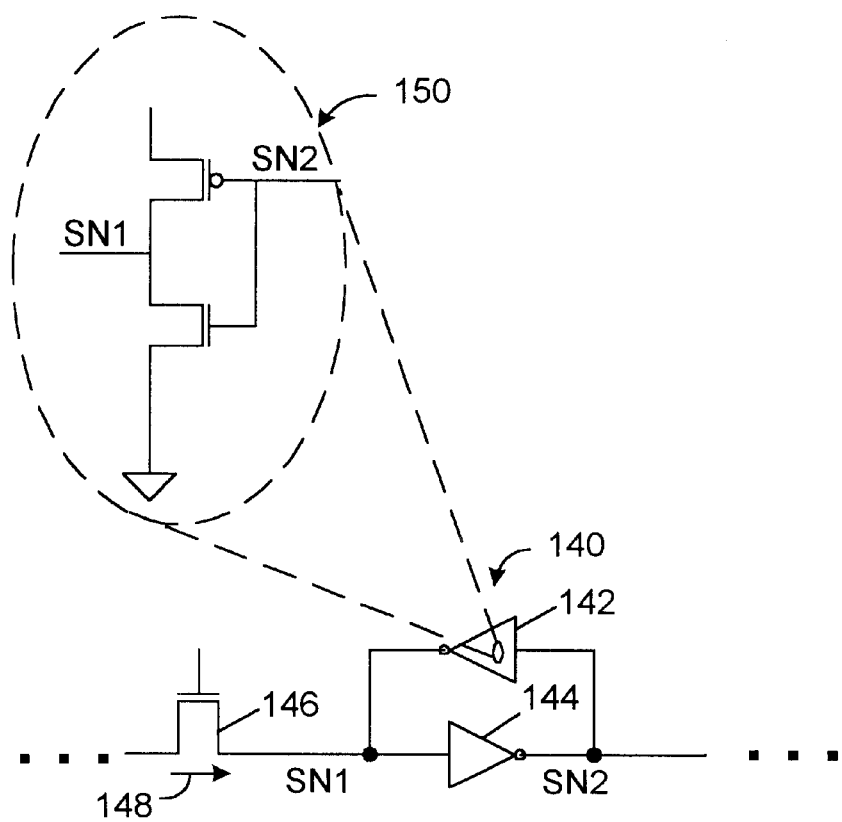
FIGS. 5A–5D are schematic diagrams that illustrate various permissible circuit configurations, in accordance with the evaluations made by the preferred embodiment of the present invention.

To further describe these configurations, reference is now made to FIG. 5A, which shows a circuit portion having a latch 140 that is driven by an NFET 146. As is known, a latch is a static gate, and both latch nodes are output nodes. Accordingly, neither node SN1 nor SN2 is identified by the present invention as being susceptible to floating. As is further known, the latch 140 comprises a pair of inverter elements 142 and 144 connected in a circuitous configuration. The inverters 142 and 144 have been illustrated with their logic schematic symbols, rather than at the transistor level. However, and as is known, each inverter element 142 and 144 may be readily constructed from a pair of FET transistors (as illustrated at 150).

By way of illustration, if NFET 146 drives the value at storage node 1 (SN1) to a logic low, then the inverter 144 will drive the value at storage node 2 (SN2) to a logic high. The value SN1 will remain a logic low, even if NFET 146 turns off, by virtue of inverter 142. Specifically, inverter 142 will drive the value of SN1 low, by inverting its logic high input provided at SN2. In this way, the circuitous configuration of the inverter elements 142 and 144 create a memory element that preserves the values at SN1 and SN2 until one of these nodes is driven to another value by an external device.

If the system and method of the present invention identifies a configuration like that of FIG. 5A, then the node is not identified as being subject to adverse affects of floating.

Figure 5B:
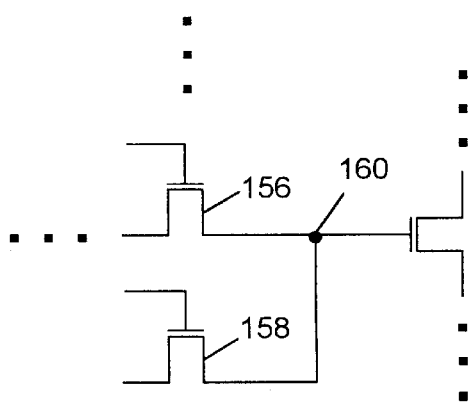

Reference is now made to FIG. 5B, which shows multiple FETs 156, 158 that are configured to drive a common node 160. As previously mentioned, a node that is determined to be the output of a multiplexer is not identified as a node that is susceptible to adverse affects of floating. In accordance with the preferred embodiment of the present invention, whenever two or more pass gates are identified as driving a common node, it is presumed that the two or more gates are a part of a multiplexer. Therefore, this node will not cause the electrical rules checker 100 to generate a warning message with regard to the potential of the node to float.

Figure 5C:
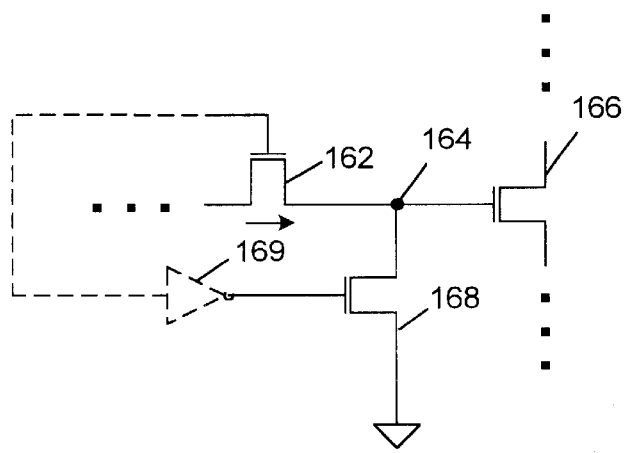
Figure 5D:
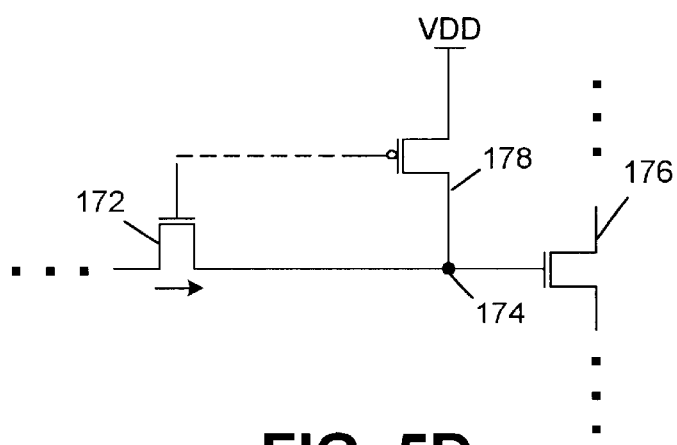

FIGS. 5C and 5D illustrate closely related circuit configurations, which are also assumed to have no adverse floating consequences. Referring first to FIG. 5C, the circuit includes a pass FET 162 that is disposed to drive a node 164, which is connected to a gate node of a FET 166. A NFET 168 is included in this configuration. While, absent NFET 168, the circuit configuration appears like the configuration of FIG. 4, the preferred embodiment of the present invention deems node 164 not to be subject to adverse affects of floating if the node is channel connected through a NFET to ground, and if the gate node of the FET 168 is the static inverse of the gate node of the pass FET 162. This static inverse relationship is illustrated by an inverter 169 depicted in dashed line. In operation, this static inverse relationship may be retrieved from the data structure or from the netlist output from PathMill, or other static timing analyzing program.

Reference is now made to FIG. 5D, which shows a similar configuration. Like the circuit of FIG. 5C, the circuit of FIG. 5D includes a pass FET 172 that is disposed to drive a node 174, which is connected to a gate node of a FET 176. An additional PFET 178 is channel connected through a PFET to VDD. In addition, the gate node of the PFET 178 is the same sense (i.e., not the static inverse) of the gate node of the pass FET 172, (the static inverse relationship is depicted by dashed line). Accordingly, when the system or method of the present invention identifies this circuit configuration surrounding node 174, it does not flag the node 174 as being susceptible to adverse affects if left floating.

Figure 6A:
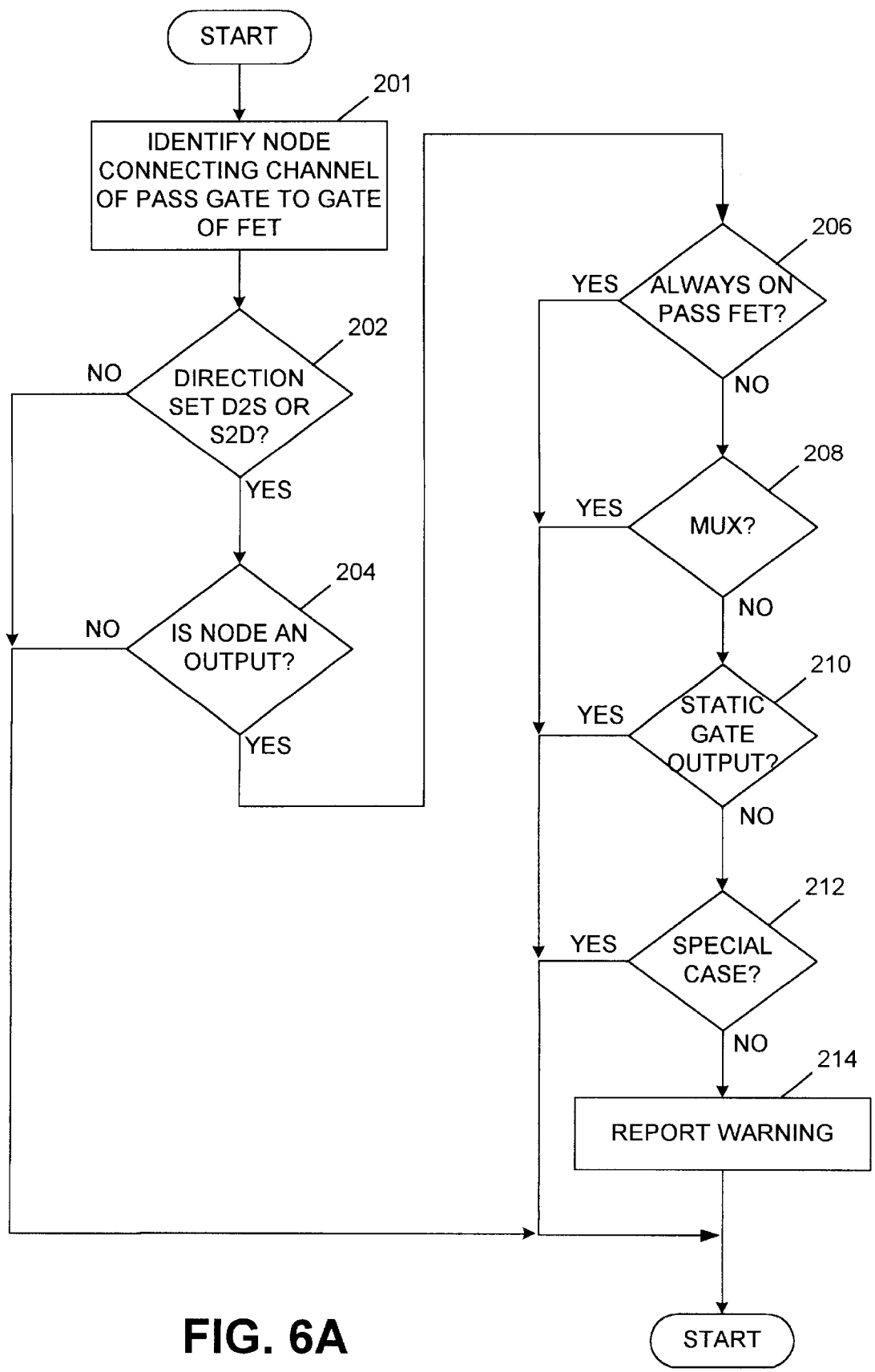
FIGS. 6A and 6B, collectively, are a flow chart illustrating the top-level functional operation of a method for identifying nodes that are susceptible to floating.
Figure 6B:
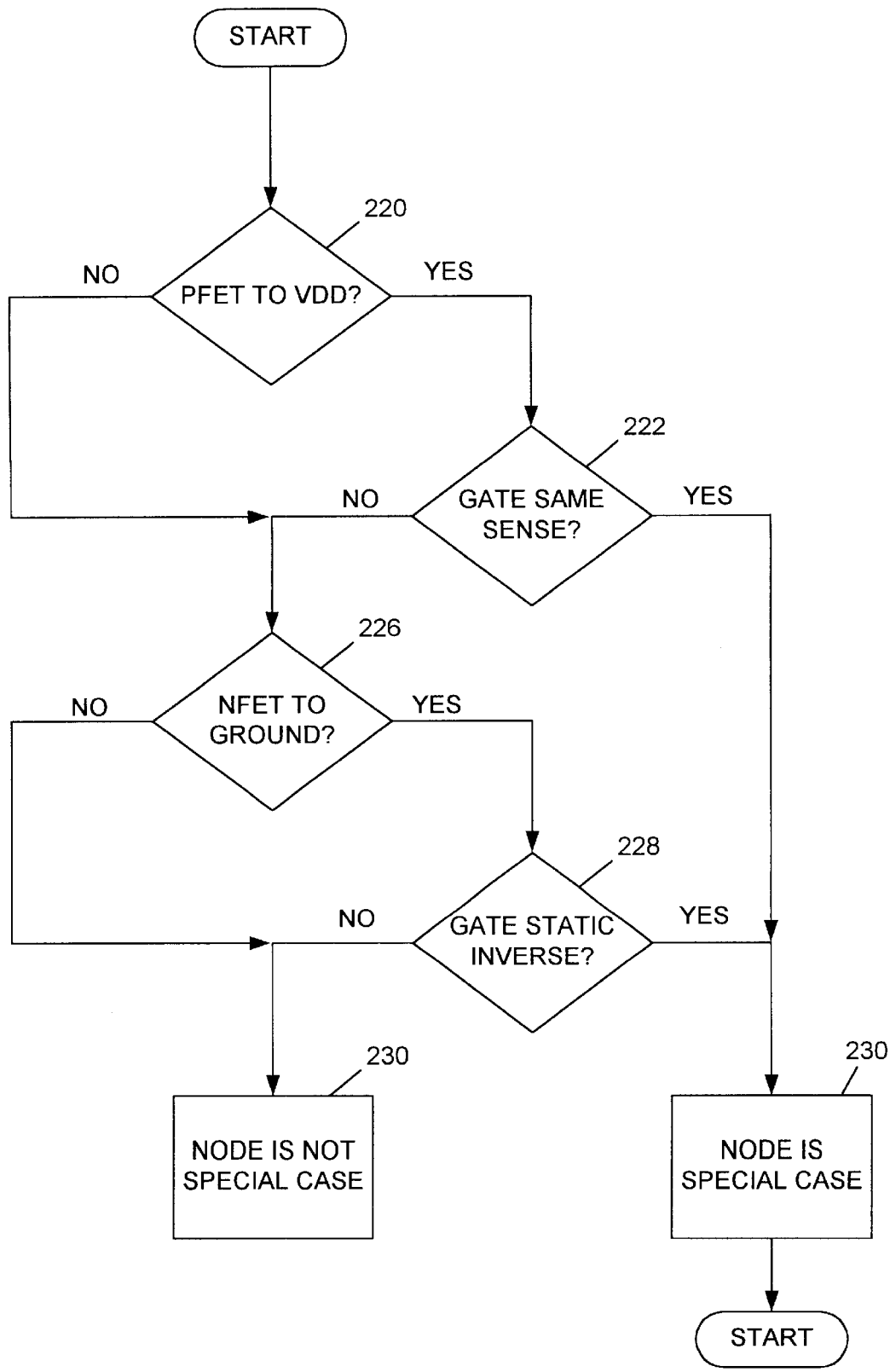

Reference is now made to FIGS. and 6A and 6B, which collectively comprise a flowchart illustrating the top level functional operation of a method operating in accordance with the present invention. The method illustrated in FIGS. 6A and 6B depicts the basic evaluation that is undertaken at any given node of a circuit. It will be appreciated that the evaluation illustrated in the flowchart is made independently for each node of the circuit. As a starting point, the method identifies (step 201) a node that interconnects a pass gate channel node with a gate node of a FET (i.e., the circuit structure of FIG. 4).

In the illustrated embodiment, the method determines whether a current node is an output node of pass gate. In accordance with the preferred embodiment, the method carries out this evaluation by determining whether the direction of the pass gate has been set as either source to drain or drain to source (step 202). If the direction of the pass gate has not been set, then the routine may end, and the method will not flag the particular node as being subject to the adverse effects of floating. Of course, if more than one pass gate is identified as being channel connected to the current node, then the evaluation of step 202 will be undertaken for each such pass gate.

If step 202 evaluates to true (i.e., the direction of the pass gate has been set), the method then determines whether the current node is an output node to the pass gate (step 204). If not, the method concludes that the current node is not subject to the adverse effects of floating and the routine may end. Otherwise, the method of the present invention may continue to perform other tests and evaluations upon the node. In this regard, the method may then evaluate the pass FET/pass gate to determine whether it is always on (step 206). As will be appreciated by persons skilled in the art from the discussion provided herein, this characteristic of a given FET may be predetermined and stored in the element data structure. If the pass gate is determined to be one that is always on, then the method concludes that the current node is not subject to the adverse effects of floating. Otherwise, the method will continue by performing additional evaluations.

The next evaluation that the method may perform is to determine whether the current node is an output node of a multiplexer (step 208). In the preferred embodiment, the method of the present invention makes certain assumptions to simplify the process identifying a multiplexer output. To this end, the preferred method assumes that multiple pass FETs, each having a common output node comprise part of a multiplexer. Thus, if the node currently under evaluation by the method is determined to be a common output node for multiple pass gates, then the method assumes the current node to be an output node of a multiplexer, and the current node is not considered to suffer from the adverse effects of floating. Otherwise, the method will continue performing additional evaluations.

As one such additional evaluation, the present invention determines whether the current node is an output node of a static gate (step 210). This information may be readily obtained by referencing a node data structure, of the type constructed in a manner described in connection with FIGS. 3A–3C above. If the current node is an output of a static gate, then the method assumes that there are no adverse effects that may arise due to the node floating. Otherwise, the method may continue by performing additional evaluations. One such additional evaluation determines whether the node is configured in one or more special case configurations (step 212). If so, then the method assumes that there are no adverse consequences due to the node floating. Otherwise, the method assumes that the node may be subject to adverse consequences of floating, and may generate a report that identifies this particular node as being potentially problematic for this reason (step 214).

Reference is now made to FIG. 6B, which is a flowchart depicting the top-level functional operation of the special case step 212 of FIG. 6A. The special case method of the preferred embodiment identifies either of the special case circuits previously illustrated and described in connection with FIGS. 5C and 5D. In this regard, the method may first evaluate the elements connected to the node to determine whether a PFET is channel connected to the node, and also to VDD (step 220). If so, the method then determines whether the gate of that PFET is the same sense as the gate of the pass FET (step 222). If so, the method identifies the circuit as one of the special case circuit structures (step 232), and concludes that the current node is not subject to the adverse effects resulting from floating. Otherwise, the method will continue to evaluate the circuitry surrounding the node to determine whether it is subject to another special case circumstance.

In this regard, the method evaluates the node to determine if any NFETs are channel connected to the node and also to Ground (step 226). If so, then the method determines whether the gate of the NFET is the static inverse of the gate node of the pass FET (step 228). If so, then the second special case circuit is identified (step 232), and the method assumes that the node is not subject to the adverse effects from floating. Otherwise, if either step 226 or step 228 results to NO, then the method concludes that the current node is not surrounded by any special case circuitry (step 230), and a warning message may be generated (step 214 of FIG. 5A).

It will be appreciated that the method of the present invention may be readily expanded to specifically identify other special case circuits, wherein a given node may be deemed to be unaffected (adversely) to any risk of floating. It will be further appreciated that the various tests and evaluations set forth in the flow chart of FIGS. 6A and 6B may be carried out in a differing order than that specifically illustrated.

Figure 7:
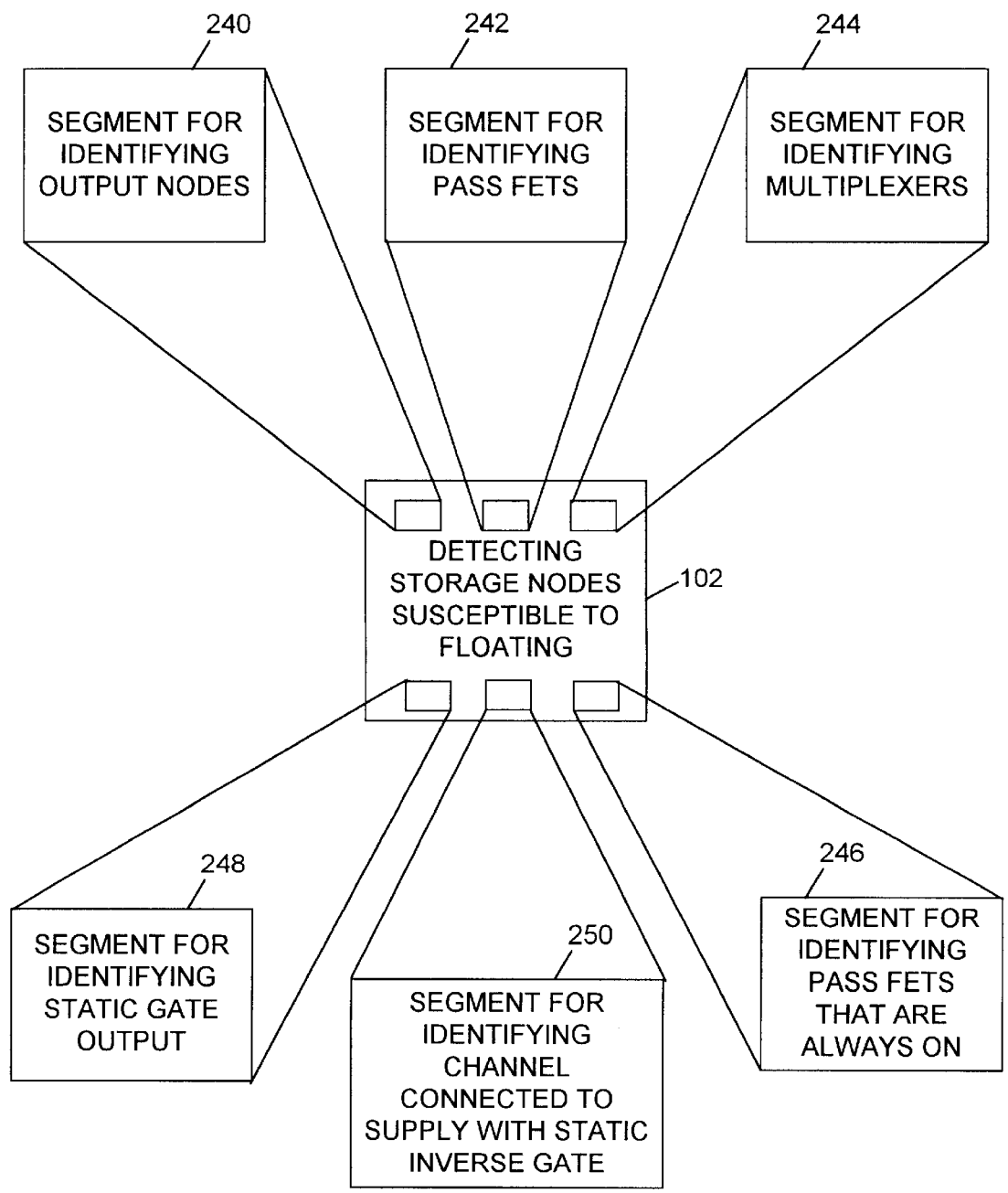
FIG. 7 is a block diagram illustrating certain fundamental code segments comprising a system constructed in accordance with the invention.

It will be appreciated that the steps illustrated in the flow charts of FIGS. 3A–3C and 6A–6B are provided for purposes of illustration and are not deemed to be limiting on the broader aspects of the present invention. Indeed, the broader aspects of the invention may be implemented using a variety of different approaches that are still consistent with the scope and content of the present invention. As illustrated in FIG. 2, a portion 102 of the electrical rules checker program 100 of the present invention is configured to detect nodes that are susceptible to floating. In accordance with this broad aspect of the present invention, a system may be provided for detecting such floating nodes. In the preferred embodiment, the system comprises software which may be provided on a computer readable storage medium in the form of code segments that are particularly configured to perform various functions. In this regard, reference is now made to FIG. 7 which illustrates certain functions which may be carried out by a system constructed in accordance with the teachings of the invention. For example, a first code segment 240 may be provided for identifying output nodes. Another segment 242 may be provided for identifying elements as pass FETs. Another segment 244 may be provided for identifying multiplexers. Still another segment 246 may be provided for identifying pass FETs that are always ON. Yet another segment 248 may be provided for identifying static gate outputs. Still one or more additional segments may be provided for identifying special case circuits. For example, one such segment may be provided for identifying FETs that are channel connected between a current node and a supply (e.g., NFET to Ground or PFET to VDD), and further determining whether the gate node of the FET is the static inverse of the gate node of a pass FET associated with a given node.

It should be appreciated that the flow charts of FIGS. 3A–3C and 6A–6B show the top-level operation of only one possible implementation of the methods of the present invention. In this regard, each block represents a module, segment, or portion of code, which comprises one or more executable instructions for implementing the specified logical function(s). It should also be noted that in some alternative implementations, the functions noted in the blocks may occur out of the order noted in FIGS. 3A–3C and 6A–6B. For example, two blocks shown in succession may in fact be executed substantially concurrently or the blocks may sometimes be executed in the reverse order, depending upon the functionality involved.

The foregoing description is not intended to be exhaustive or to limit the invention to the precise forms disclosed. Obvious modifications or variations are possible in light of the above teachings. In this regard, the embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. A method for detecting a node that is susceptible to floating, comprising the steps of:
    detecting a node that is an output of a pass gate;
    ensuring that the node is not an output node of a static gate;
    determining that the node is not an output of a multiplexer;
    verifying that the output is not always on; and
    determining that the node drives a FET gate.

2. The method as defined in claim 1, further including the step of ensuring that the node does not include a NFET that is channel-connected to Ground having a gate that is the static inverse of a gate node of the pass gate.

3. The method as defined in claim 1, further including the step of ensuring that the node does not include a PFET that is channel-connected to VDD having a gate that is the same sense as a gate node of the pass gate.

4. The method as defined in claim 1, wherein the step of detecting a node that is the output of a pass gate further includes the step of evaluating all elements that are channel connected to the node.

5. The method as defined in claim 4, wherein the step of evaluating all elements more specifically includes the step of evaluating a data structure for each element that is channel connected to the node.

6. The method as defined in claim 1, wherein the step of determining that the node is not an output of a multiplexer more particularly includes the step of verifying that no more than one pass gate drives the node.

7. The method as defined in claim 6, wherein the step of verifying that the node is not an output of a pass gate that is always on further includes the step of evaluating a data structure of the pass gate to ensure that a direction flag is set to one of two conditions: drain-to-source and source-to-drain.

8. A method for determining whether a node is susceptible to floating, comprising the steps of:
    ensuring that the node is an output of a pass gate;
    verifying that only one pass gate drives the node;
    ensuring that the output is not an output node of a static gate;
    determining that the node drives a FET gate.

9. The method as defined in claim 8, further including the step of ensuring that the node does not include a NFET that is channel-connected to Ground having a gate that is the static inverse of a gate node of the pass gate.

10. The method as defined in claim 8, further including the step of ensuring that the node does not include a PFET that is channel-connected to VDD having a gate that is the same sense as a gate node of the pass gate.

11. The method as defined in claim 8, further including the step of ensuring that the only one pass gate is not always driving the node.

12. The method as defined in claim 11, further including the step of evaluating a data structure of the pass gate to ensure that a direction flag is set to one of two conditions: drain-to-source and source-to-drain.

13. The method as defined in claim 8, wherein the step of ensuring that the node is not an output node of a static gate further includes the step of evaluating a data structure for the node.

14. A computer readable storage medium containing program code for evaluating a netlist to detect a node that is susceptible to floating comprising:

a first code segment configured to detect a node that is an output of a pass gate;

a second code segment configured to ensure that the node is not an output node of a static gate;

a third code segment configured to determine that the node is not an output of a multiplexer;

a fourth code segment configured to verify that the output is not always on; and a fifth code segment configured to determine that the node drives a FET gate.

15. The computer readable storage medium as defined in claim 14, further including a sixth code segment configured to ensure that the node does not include a NFET that is channel-connected to Ground having a gate node that is the static inverse of a gate node of the pass gate.

16. The computer readable storage medium as defined in claim 14, further including a sixth code segment configured to ensure that the node does not include a PFET that is channel-connected to VDD having a gate node that is the same sense as a gate node of the pass gate.

17. The computer readable storage medium as defined in claim 14, wherein the first code segment is further configured to evaluate all elements that are channel connected to the node.

18. The computer readable storage medium as defined in claim 17, wherein the first code segment is more specifically configured to evaluating a data structure for each element that is channel connected to the node.

19. The computer readable storage medium as defined in claim 14, wherein the third code segment is more particularly configured to verify that no more than one pass gate drives the node.

20. The method as defined in claim 19, wherein the the third code segment verifies that no more than one pass gate drives the node by evaluating a data structure of the pass gate to ensure that a direction flag is set to one of two conditions: drain-to-source and source-to-drain.

* * * * *